United States Patent [19]

Naaijer

[11] 4,074,149
[45] Feb. 14, 1978

[54] PEAK DETECTING WITH CONSTANT FRACTIONAL OFFSET

[75] Inventor: Geert Jan Naaijer, Limeil-Brevannes, France

[73] Assignee: U.S. Philips Corporation, New York, N.Y.

[21] Appl. No.: 522,116

[22] Filed: Nov. 8, 1974

[30] Foreign Application Priority Data

Nov. 9, 1973 France .............................. 73 39857
Nov. 9, 1973 France .............................. 73 39858
Nov. 22, 1973 France .............................. 73 41594

[51] Int. Cl.² .................... H03K 5/153; G01R 19/04
[52] U.S. Cl. ................................. 307/351; 307/359; 324/103 P; 328/151
[58] Field of Search ................. 307/235 A–235 C, 307/235 J, 235 K; 324/103 P; 328/151, 182

[56] References Cited

U.S. PATENT DOCUMENTS

| 3,211,984 | 10/1965 | Jones | 307/235 A X |
| 3,287,570 | 11/1966 | Wilson | 307/235 A |
| 3,348,065 | 10/1967 | Schmidt | 307/235 J X |
| 3,508,158 | 4/1970 | Marchese | 307/235 A X |
| 3,805,146 | 4/1974 | Culley | 307/235 A X |

FOREIGN PATENT DOCUMENTS 1,298,712   6/1962   France .............................. 307/235 A

OTHER PUBLICATIONS

Klatt, "Narrow Peaks Caught by Better Detector"; EDN/EEE(public.); vol. 16, No. 16; 8/1971; p. 43.
Bidwell et al., "Peak Detector and Average Detector"; IBM Tech. Discl. Bull.; vol. 9, No. 4, pp. 426–428; 9/1966.
Smith et al., "Peak and Valley Detector"; IBM Tech. Discl. Bull.; vol. 8, No. 6, pp. 910–911; 11/1965.
Nielsen, "Base-to-Peak Amplitude Detector;" IBM Tech. Discl. Bull.; vol. 16, No. 7, pp. 2148–2149; 12/73.

Primary Examiner—Larry N. Anagnos
Attorney, Agent, or Firm—Frank R. Trifari; Daniel R. McGlynn

[57] ABSTRACT

A peak detector for electrical signal peaks including a capacitor which is charged, via a rectifying element, to a voltage corresponding to the peak value. At the end of the peak a discharging element connected parallel to the capacitor is activated for a predetermined period of time, with the result that the capacitor is discharged over a fixed fraction of its peak voltage. At the end of the predetermined period of time, the discharging element is reactivated, with the result that a substantially constant voltage remains as a reference level.

4 Claims, 14 Drawing Figures

PEAK DETECTING WITH CONSTANT FRACTIONAL OFFSET

The invention relates to a device for detecting a series of signal peaks of varying amplitude which appear on an input of a difference determining element forming part of the device. It comprises an analog storage element which is connected to an input of the difference determining element and which serves for the storage of an electrical quantity, having a value which corresponds to a fraction of the amplitude of a most recent signal peak the value determining a reference level, an increasing element for the electrical quantity which is to be activated by a later signal peak when the reference level then prevailing is exceeded, and a decreasing element for the electrical quantity which is active between successive increases. A device of this kind is found in British Patent Specification No. 1,066,884. The storage element (FIG. 1 of this Patent Specification) is a capacitor, one plate of which is connected to ground, the other plate being connected, via a diode, to a center tapping of a voltage divider which is connected between the input terminal of the device and ground. The capacitor is bridged by a resistor having a high value with respect to the voltage divider. The capacitor is quickly charged at a comparatively high input voltage. The capacitor is slowly discharged between successive voltage peaks. Furthermore, the input terminal of the device and the voltage-carrying plate of the capacitor are connected to inputs of an amplifier. Consequently, the latter has as an output signal the difference between the input signal and a slowly varying mean value. However, the position of the reference level is dependent on the recurrence time of the signal peaks, and on the signal value therebetween. If substantial noise is present a comparatively high reference level is desirable. In the case of a moderate decrease of the peak height it is then possible to detect further peaks. However, the discharge current can be increased. In that case, however, the reference level can quickly drop in a short time. If no signal peaks appear for some time, the reference level then drops below the amplitude of the interference. The object of the invention is to enable variations in the height of successive signal peaks to become quickly manifest in the said reference level. Another object of the invention is to provide a substantially constant reference level between successive peaks. The invention enables the use of a comparatively high reference level, so that a substantial protection against noise is provided. This object is achieved according to the invention by providing a timer having an output which has connected thereto a control input of the said decreasing element, the said exceeding of the prevailing reference level activating the said timer for a predetermined time which is independent of the time spacing between two signal peaks, the said decreasing element determining the reference level as a predetermined fraction of a most recent signal peak. A quick-acting decreasing element can thus be used. A stationary reference level is then already present shortly after reception of the most recent signal peak, and the protection against the detection of interference peaks is maintained. An advantageous peak detector for non-periodic signals is thus obtained. An advantageous peak detector is obtained for signals having a small signal-to-noise ratio. A peak detector of this kind can be advantageously used, for example, for the detection of signal peaks which are produced when magnetic tape is read. The peak detector enables the reconstruction of well-defined signal peaks from a distorted input signal.

The analog storage member is preferably a capacitive element and the decreasing element is preferably a transistor having a current which is to be rendered conducting and which is connected parallel to the capacitive element, a control electrode of the said transistor being controlled by the timer so that the said current path either has a comparatively low resistance or a comparatively high resistance, the said timer being started by a signal produced by the termination of the activity of the increasing element. This represents a very attractive realization of the idea of the invention.

The said transistor is preferably a field-effect transistor which is connected in series with a resistor. The very high resistance of a cut-off field-effect transistor ensures that once a reference level has been adjusted, it is maintained for an extremely long period of time.

An output of the difference determining element, constructed as a differential amplifier is a preferably connected via an increasing element, constructed as a rectifying element, to a plate of said capacitive element. As a result that under the control of the conductive state of the said rectifying element of feedback loop having a gain factor substantially equal to 1 is formed, and that under the control of the cut-off state of the said rectifying element an open loop is formed having a gain factor substantially larger than 1, an output pulse which is formed at that instant activating the timer. The timer is thus activated in a very reliable manner.

The said capacitive element preferably has connected in series therewith a resistor, signals on one end of the said resistor activating the said timer under the influence of current variations occurring in the resistor. An RC-combination of this kind has a differentiating action. Thus control signals can be easily generated.

The said difference determining element and the increasing member are preferably formed by a second transistor, having a first electrode which is connected to said input, a second electrode which is connected to a plate of said capacitive element, and a third electrode which is connected to a supply source provided with an output resistor, the said timer being activated under the control of a signal on said third electrode. Control signals are thus very readily and reliably generated.

The analog storage element and the decreasing element are preferably formed by an inter-electrode capacitance and an inter-electrode current path, respectively, of an MOS transistor. Two different functions are thus embodied by a single circuit element; this offers a substantial saving.

In another preferred embodiment of the device according to the present invention, binary information elements are stored in a magnetizable substrate which is driven along a read element at a uniform speed. Each binary information element is stored in at least three successive intervals of the substrate, each interval having a different magnetization, and the magnetization direction being changed between the second and the third interval. The magnetization values embodied in the second and the third interval are detected as signal peaks by a full wave signal peak detector as described above. It was found that the combination of a full-wave signal peak detector as described and a known code offer a surprisingly good solution for the storage of digital information elements on a magnetizable substrate.

On the said magnetizations an alternating magnetization is preferably superimposed during all three said intervals, As a result, a number of signal peaks can be detected at each interval so that an even better protection against interference is achieved.

A detection member for an isolated information element which serves as an announcing element for a word is preferably connected to an output of the said full-wave signal peak detector. A reliable separation between successive words is thus achieved.

The described device is preferably built in a known miniature cassette tape recorder. Thus, such an inexpensive tape recorder need not be modified in any way as regards the mechanical and record/playback section for the storage of binary information elements.

The invention will be described in detail hereinafter with reference to FIGS. 1-14.

Figure 1:
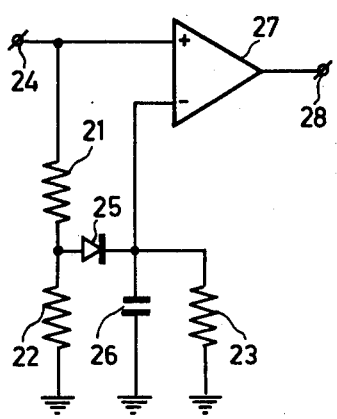
FIG. 1 shows a known peak detector.

FIG. 1 shows a known peak detector as described in the said British Patent Specification No. 1,066,884. The signal peaks appear on the input 24. The reference level is derived from the centre tapping between resistors 21 and 22, and is stored in the capacitor 26 via diode 25. The capacitor is slowly discharged via the resistor 23. If a signal peak becomes higher than the voltage on the capacitor 26, the differential amplifier 27 supplies an output signal on terminal 28. This detector is not suitable for signals of variable peak height and interval between the peaks. If the interval is large, the voltage on the capacitor will decrease substantially, and noise peaks are also liable to be detected. If the resistors 21 and 22 are equal, the reference level is initially equal to half the most recently received peak value. If the next peak is smaller than this half, it will not be detected. A further drawback is the fact that the charging cannot take place very quickly because of the resistor 21, and the input signal is continuously loaded by the series resistors 21, 22.

Figure 2:
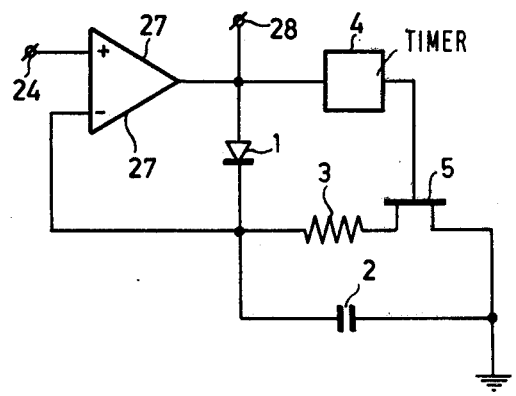
FIG. 2 shows a first peak detector according to the invention.
Figure 6:
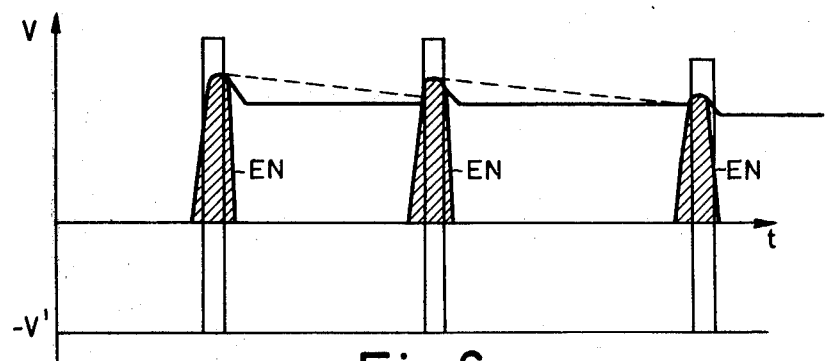
FIG. 6 shows electrical wave forms occurring in peak detectors according to the invention.

FIG. 2 shows a first peak detector according to the invention. The peak detector comprises a signal input 24, a differential amplifier 27, a rectifying element 1, a capacitor 2, a resistor 3, a field-effect transistor 5, a timer 4 (for example, a monostable multivibrator), and a signal output 28. In FIG. 2 the decreasing element, i.e. the discharging device, is realized by means of the resistor 3 which is connected to the drain electrode of the field-effect transistor 5, the source electrode of which is connected to ground. The control electrode of this transistor is connected to an output of a monostable multivibrator 4, the input of which is connected to the output of a differential amplifier 27. The other end of the resistor 3 is connected to the diode 1, the second input of the differential amplifier 27 and the capacitor 2. The operation of this circuit will be described inter alia with reference to FIG. 6. A non-interrupted line in this Figure denotes the voltage variation across the capacitor as a function of the time. During signal peaks the capacitor 2 is charged to the peak value of the output signal of the differential amplifier 27, and hence to the peak of the input signal EN on the input 24. After passage of the peak, the diode 1 is cut off and the differential amplifier operates as if it were connected in an open loop. As a result, the output voltage (squarewave signal) quickly decreases to a value in the vicinity of the supply voltage $-V'$. The trailing edge of a signal block each time starts the timer 4 which thus supplies a voltage pulse of a predetermined length (controllable), whereby the field-effect transistor 5 is rendered conductive, and the capacitor 2 is partly discharged via the resistor 3. The ratio between the length of the said voltage pulse and the RC-time of capacitor 2 and resistor 3 determines the extent to which the capacitor 2 is discharged. This fraction may be, for example, 10 or 20% or another suitable value. At the end of the pulse of the timer 4, the field-effect transistor 5 is cut off, after which the charge of the capacitor remains very accurately constant.

Figure 3:
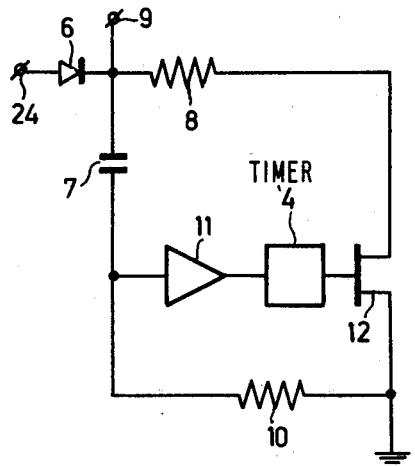
FIG. 3 shows a second peak detector according to the invention.

FIG. 3 shows a second embodiment according to the invention. The input terminal 24 thereof is connected directly to the diode, the other pole of which is connected to the capacitor 7, the resistor 8 and the output terminal 9. The other plate of the capacitor 7 is connected to ground, via the resistor 10, and further to the amplifier 11, the output of which has the timer 4 connected thereto, which controls the field-effect transistor 12. The field-effect transistor 12 is connected between resistor 8 and ground. As in FIG. 2, the capacitor 7 is charged to the peak voltage via the diode 6 when a signal peak occurs. During charging, a comparatively large current flows through the resistor 10 which has a comparatively low value. When the peak voltage is reached, this current decreases to a very low value. The large difference between the two currents causes a quick voltage variation on the input of amplifier 11; the voltage variation is amplified, while the trailing edge starts the timer 4, which, as previously, renders the field-effect transistor 12 conductive for a predetermined period of time, with the result that the capacitor 7 is discharged over a fixed fraction.

Figure 4:
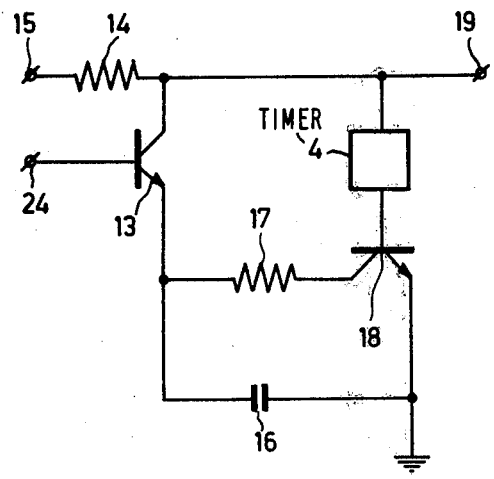
FIG. 4 shows a third peak detector according to the invention.

FIG. 4 shows a further circuit according to the invention. The input signal arrives on the base electrode of transistor 13, the collector electrode of which is connected, via the resistor 14, to the supply terminal 15 on which a positive voltage can be received. The emitter electrode of transistor 13 is connected to capacitor 16 and, via the limiting resistor 17, to the collector electrode of the transistor 18. The other plate of capacitor 16 and the emitter electrode of transistor 18 are connected to ground; the base electrode of transistor 18 is connected to the output of the timer 4, the input of which is connected to an output terminal 19 and to the collector electrode of transistor 13.

If no signal peak arrives, transistor 13 is cut off, while the terminal 19 carries the supply voltage. If the input voltage becomes higher than the voltage on the capacitor 16, increased by the base-emitter voltage drop of the transistor 13, transistor 13 becomes conductive with the result that a negative pulse appears on the output terminal which has a value, for example, of a few volts. Immediately after the peak, transistor 13 is cut off again, and the output voltage (terminal 19) becomes equal to the supply voltage. Consequently, for every voltage peak received, a negative pulse appears on the output terminal. The trailing edge of this pulse starts the timer 4 which renders the transistor 18, originally cut off, conductive for a predetermined period of time. As already described, capacitor 16 is then discharged over a predetermined fraction.

Figure 5:
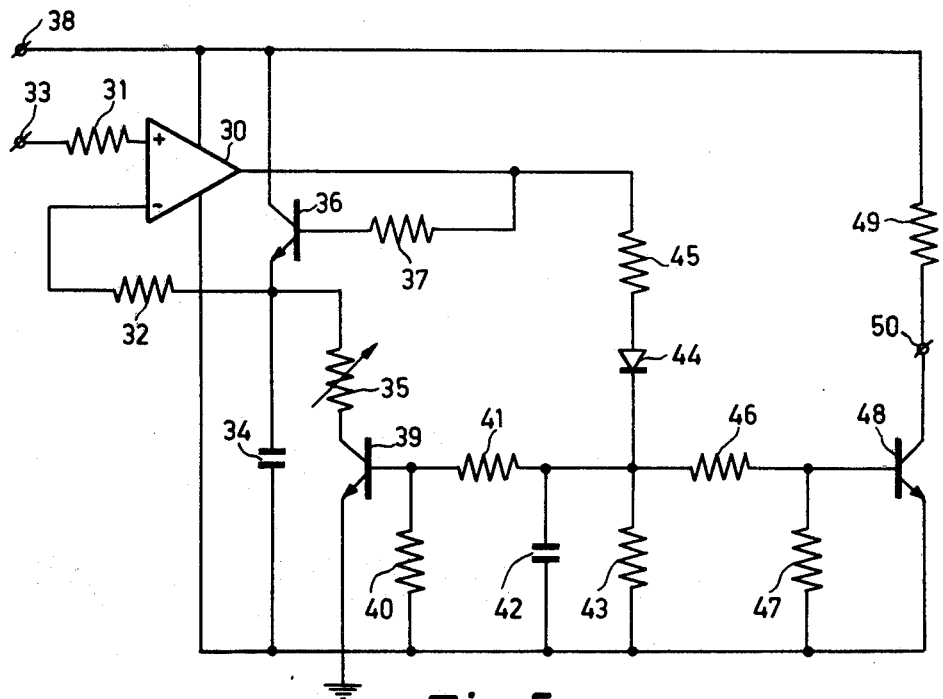
FIG. 5 shows a preferred embodiment of a peak detector according to the invention.

FIG. 5 shows a further elaborated device according to the invention. This device comprises a current-controlled differential amplifier 30, the supply connections of which are connected to the terminal 38 and to ground. The positive input thereof receives, via resistor 31, the input signal on terminal 33. The negative input is connected, via the resistor 32, to the capacitor 34, the resistor 35 and the emitter electrode of transistor 36. The base electrode of the said transistor is connected via the resistor 37, to the output of the differential amplifier 30 and the collector electrode is connected to the supply terminal 38. The (variable) resistor 35 is furthermore connected to the collector electrode of the transistor 39. The emitter electrode of this transistor is connected to ground. The base electrode thereof is connected via the resistor 40, to ground and furthermore to the resistor 41. The other end of this resistor is connected to ground by way of the parallel connected capacitor 42 and resistor 43, to the output of the differential amplifier 30 by way of the series-connected diode 44 and resistor 45, and further to the resistor 46. The resistor 45, the diode 44 and the capacitor 42 together constitute the timer (for example, element 4 in FIGS. 2-4). The second end of resistor 46 is connected, via the resistor 47, to ground and furthermore directly to the base electrode of the transistor 48. The emitter electrode thereof is connected to ground, its collector electrode being connected, via the resistor 49, to the supply terminal 38. The output signal appears on the terminal 50. The operation of the device substantially corresponds to that shown in the FIGS. 2-4. The input signal appears on terminal 33. The capacitor 34 is charged under the control of the voltage difference between the base electrode and the emitter electrode of transistor 36. The controlled interrupting switch is formed by transistor 39. The discharge current is limited by resistor 35. The timer is controlled as already described: the capacitor 42 is again charged by the same output signals of the differential amplifier 30. The resistors 40, 41, 43, 46 and 47 are proportioned such that the transistors 39, 48 are together saturated for a properly defined time interval. During this time interval transistor 39 behaves as a closed switch; the voltage on terminal 50 is approximately 0 volts. At the end of said interval, the transistors 39, 48 are cut off and the voltage on terminal 50 becomes substantially equal to the supply voltage (terminal 38). The variations on point 50 follow the variations on the input and cause a rectangular pulse each time a signal peak is detected. It was found that this circuit offers favorable results in unfavorable circumstances also.

The components have the following characteristic: transistors 36, 39, 48: BC409; differential amplifier 30: LM 3900N; capacitor 34: 100 nF; capacitor 42: 4.7 nF; resistors 31, 32: 100,000 ohms; resistor 37: 5100 ohms; resistor 45: 5600 ohms, resistors 49, 35: 10,000 ohms (adjustable); resistors 40, 41, 46, 47: 47,000 ohms; resistor 43: 22,000 ohms; diode 144: 1 N914; supply voltage: +16 volts.

The idea of the invention is not restricted to the said values. It is sometimes advantageous to replace the combination of the field-effect transistor and the memory capacitor by a single MOS transistor.

Figure 7:
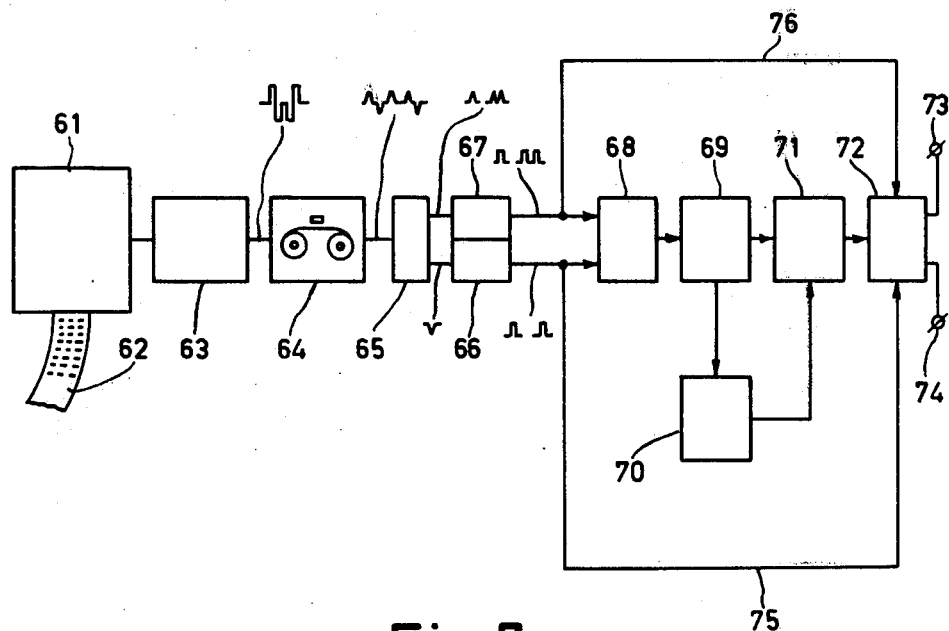
FIG. 7 shows a block diagram of a device for storing and reading digital signals on the magnetic tape of a so-termed miniature cassette recorder.

FIG. 7 shows a block diagram of a device for storing and reading digital signals on the magnetic tape of a so-termed miniature cassette recorder. The tape reader 61 provides the reading of the information of the punched tape 62 which is each time applied in groups of 8 bits in parallel, and serially transports this information under the control of a clock which is not shown. The pulse generator 63 thus receives the logic levels "0" and "1," and generates pulses having three levels and return to the zero level; this will be described in more detail with reference to FIG. 12. The pulses are subsequently recorded on the magnetic tape of a known tape recording apparatus of a simple type, for example, a miniature cassette recorder. The input signal can then also be mixed with a carrier frequency of, for example, 60 kHz; such apparatus are usually used in the linear recording range in which the magnetic layer is not saturated. This is also the case here, and the apparatus need not be modified for digital recording.

The information is read as follows: the isolating device 65 receives the read pulses transmitted by the apparatus 64 during the read operation, dispatches the positive pulses to the peak detector 67, and the negative pulses to the peak detector 66. These detectors are of a type as described with reference to FIGS. 2-5. The "positive" and "negative" output pulses are applied to the mixer 68 and, via the lines 76 and 75, respectively, to the device 72 which supplies these positive and negative pulses to the output terminals 73 and 74, respectively. The mixer 68 registers all these pulses and dispatches them to an integrator 69 which has two positions and which, when two successive pulses are lacking in the output pulse series of the mixing device 68, changes over to the other state. As soon as a next pulse is received, the integrator changes over to the other state and dispatches a pulse to the monostable multivibrator 70 which is then activated for a predetermined period of time. If the position of the integrator changes again during this period (which means that again two successive pulses are lacking in the series of output pulses of the mixer 68), the coincidence circuit 71 applies an "OK" signal to the device 72. The coincidence circuit 71 reacts to the simultaneous appearance of a transistion on the output of the integrator 68 and the active position of the monostable multivibrator 70. As a result, for the entire duration of the "OK" signal the device 72 allows passage for the pulses received via the lines 75, 76, the said pulses thus appearing on the outputs 73, 74, respectively.

Figure 8:
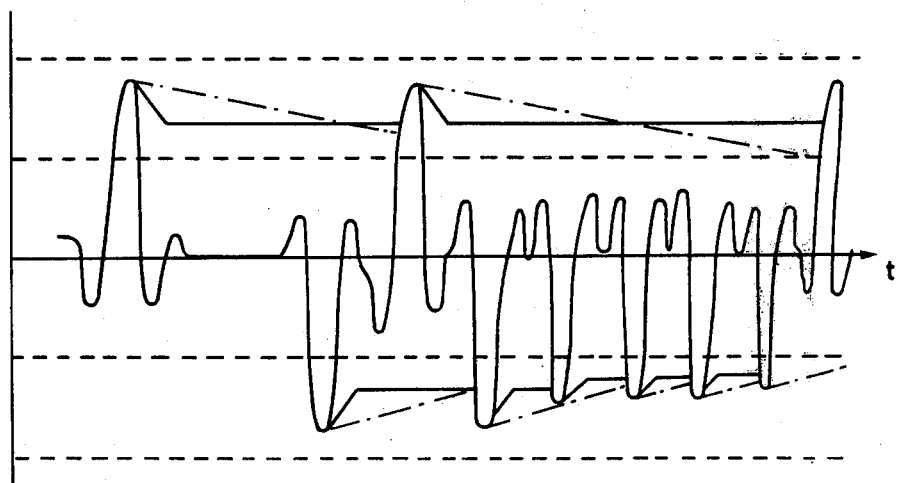
FIG. 8 shows input signals appearing in the device of FIG. 7 when use is made of the foregoing peak detectors.

FIG. 8 specifically shows the results obtained by said peak detectors when used for the output signal of a miniature cassette recorder. Notably the transistions between different magnetization directions on the tape cause peaks of high amplitude among smaller peaks and noise signals. Two non-interrupted lines denote the instantaneous reference levels of the two peak detectors used. Two pairs of broken lines each time denote the maximum signal level and the maximum interference peak level, the said values relating as 2 : 1. These circumstances were found to be very unfavorable in practice; however, for peak detectors according to the invention this is not an impediment. As in FIG. 6, a further noninterrupted line denotes the instantaneous reference level, a stroke-dot line denoting the instantaneous reference level for a detector according to FIG. 1 (resistor 21 then being equal to zero). Very soon this appears to be much lower than the reference level according to the invention, so that less protection against the detection of interference peaks remains.

Figure 9:
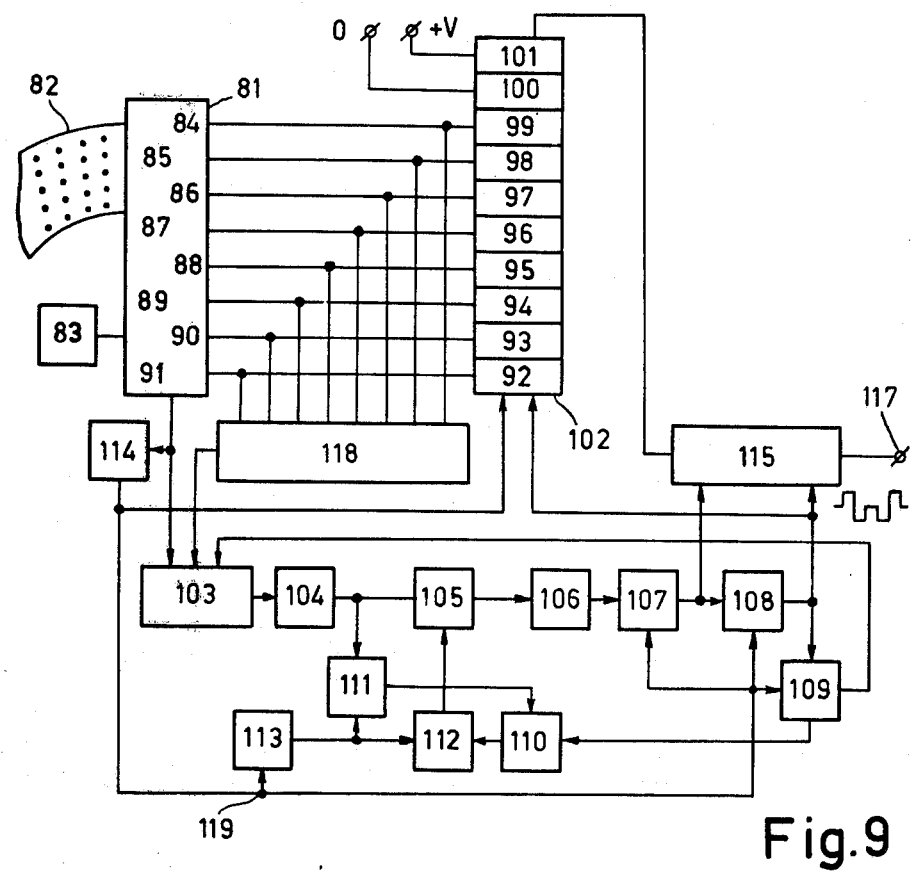
FIG. 9 shows a block diagram of a device for the conversion of logic signal levels into electrical signals which are suitable for storage in analog form.

FIG. 9 shows a more detailed diagram of the devices 61 and 63 according to FIG. 7. The element 109 is a divide-by-10 unit having the positions 0,1 . . . 9; the binary values are represented by "0" and "1," respectively. The tape reader 81 reads the punched tape 82 under the control of the clock 83. The tape reader 71 dispatches the eight binary information bits read per column to the shift register 102 and the parity detector 118. Moreover, via line 116 it dispatches a time marking (sprocket) signal to the monostable multivibrator 114 and the coincidence detector 103, which is furthermore connected to an output of the parity detector 118 and the divide-by-10 unit 109. The output of the coincidence detector 103 is connected to an input of the monostable multivibrator 104. The output thereof is connected to a coincidence detector 105 and to an input of a bistable element 111, the other input of which is connected, via the differentiator 113, to the monostable multivibrator 114. The output of the differentiator 113 is also connected to the input of a second bistable element 112, the output of which is connected to an input of coincidence detector 105. The output of the bistable element 111 is connected to a third coincidence detector 110, the other input of which is connected to an output of the divide-by-10 unit 109, its output being connected to the bistable element 112. The output of coincidence detector 105 controls a second clock 106 which is followed by frequency dividers 107, 108. The output of frequency divider 107 is connected to the pulse generator 115 which receives the information from the shift register 102. The output of the frequency divider 108 is connected to the divide-by-10 unit 109, to the pulse generator 115 and to the shift register 102. The output 119 of the monostable multivibrator 114 is furthermore connected to the divide-by-10 unit and the shift register 102.

Figure 10:
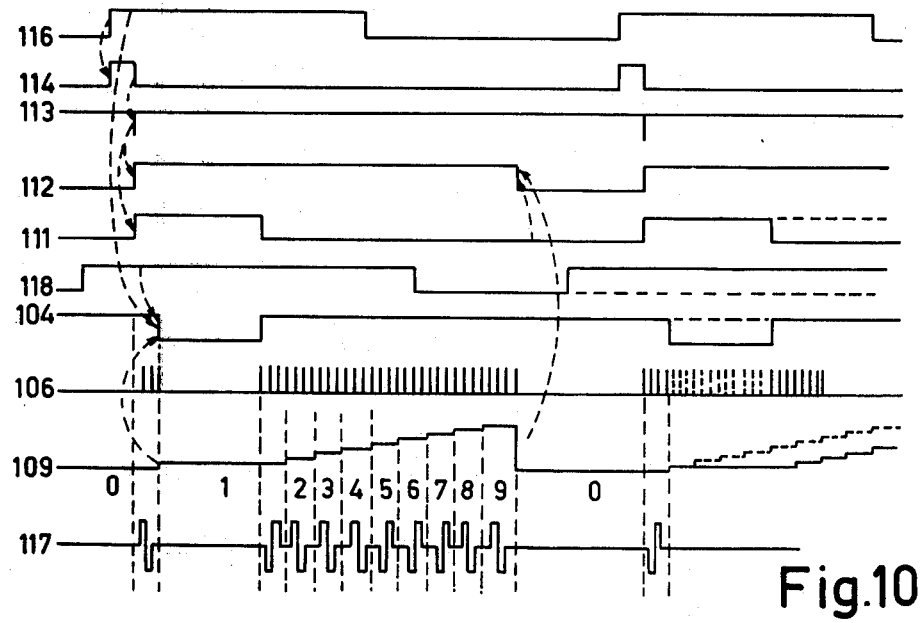
FIG. 10 shows time-dependent wave forms occurring in the device of FIG. 9.

The operation of the device will be described in detail with reference to FIG. 10 which shows a time diagram in which the signals on the outputs of the elements 116, 114, 113, 112, 111, 118, 104, 106, 109 and 117 are shown from the top downwards. The signals on the output of the element 109 are represented in the form of ten steps which correspond to the ten positions of the divide-by-10 unit. Under the control of the clock pulses of the clock 83 (having a frequency of, for example, 150 Hz) the tape reader 81 reads the columns of the tape 82. Each pulse of the clock 83 changes the logic voltage level on the line 116. The said time marking signal, therefore, has a squarewave shape. The length of a square limits the positioning and the reading of a column of information of the tape 82 in the time. The eight information bits read are supplied in parallel form to the shift register 102 which provides the parallel/series conversion and which serially applies the information to the pulse generator 115. To this end, the parity detector 118 checks the parity of the octet read, and supplies as a logic "1" signal when the parity is odd. If, moreover, the time marking signal is present and the divide-by-10 unit is in the position "1," the coincidence detector 103 sets the monostable multivibrator 104 to the active position by way of a signal. In FIG. 10 the signal on line 104 becomes low under the control of three signals, the operation of which is denoted by interrupted arrows.

If the time marking signal (line 116) becomes high, the monostable multivibrator 114 is set to the active position for a given period of time, while the falling edge of this signal is differentiated by the differentiator 113; as a result, the bistable elements 111, 112 are set to the "1" position (output becomes high). During the entire output pulse of the monostable multivibrator 104 the clock 106 is stopped, with the result that the counting forward of the divide-by-10 unit 109 is stopped: the latter remains in the position "1," at least until the end of the output pulse of the monostable multivibrator 104. Because of the two frequency dividers 107, 108, the divide-by-10 unit 109 advances to the position 2 only after four clock pulses of the clock 106, assuming that both elements 107, 108 are divide-by-two units. When the divide-by-10 unit reaches the position 0 and, moreover, bistable element 112 (and hence also the bistable element 111) was reset to the "0"-position, the clock 106 is stopped. The clock 106 is started again in reaction to the falling edge of the monostable multivibrator 114 which was set to the active position by the rising edge of the time marking signal; this is effected in the described manner. The signal generated on the output of the signal generator 117 is represented by the same number in FIG. 10. Synchronously with the output pulses of the frequency divider 108, the information in the shift register 102 is each time shifted forwards one location towards the pulse generator 115. The latter first supplies a logic "0" pulse of the correct shape, because the first stage 101 of the shift register is always filled with the supply voltage 0 volts (see isolated wave form at the left on line 117). As already stated, the pulse generator 115 does not supply a pulse as long as the monostable multivibrator 104 is in the active position. The next pulse of pulse generator 115 (corresponding to the original contents of the stage 100 of the shift register 102) is a binary "1," because the element receives an input signal +V. Every group of eight bits is preceeded by a "1," blank space, and a "0" respectively. The "1" bits and "0" bits act as test bits, the first bit of the immediately subsequent information being the parity bit. The subsequent seven information bits are followed by a blank space: the pulses of the clock 106 are blocked in that the divide-by-10 unit is returned to the position zero and the output signal of 111 is low. Via the bistable element 112, the coincidence detector 110 supplies a signal to the coincidence detector 105, with the result that the clock 106 is stopped. Subsequently, under the control of the time marking signal, which becomes high, the test bits and the next information octet are read.

The wave forms denoted by broken lines at the right in FIG. 10 represent a case where, for example, the parity detector 118 detects an error so that its output remains low. As a result, the coincidence detector 103 fails to set the monostable multivibrator 104 to the active position: the output voltage thereof remains high and the clock 106 is not blocked. The information is then shifted out of the shift register 102 without the said blank space. When read, the relevant information is considered to be unvalid.

Figure 11:
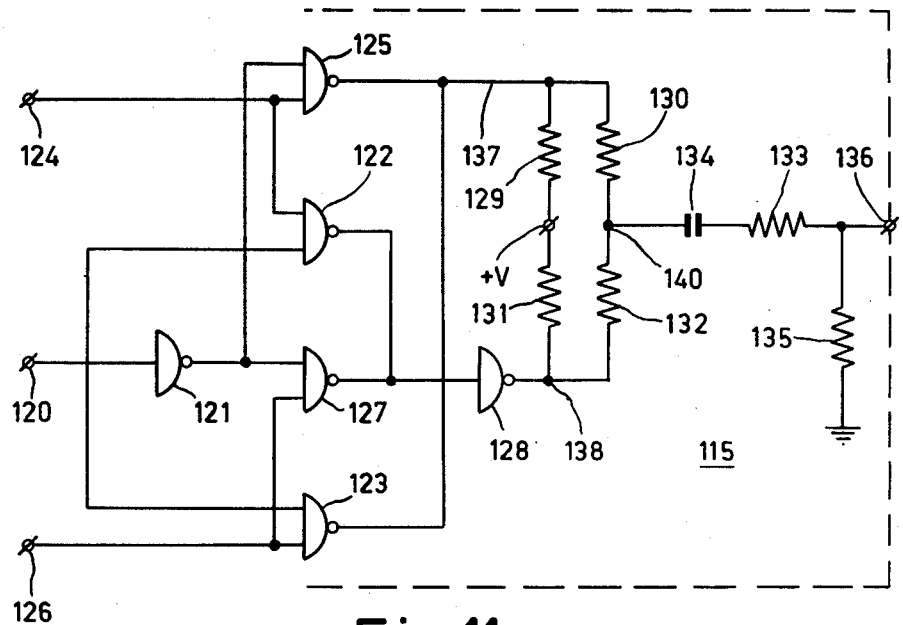
FIG. 11 is a detailed view of a part of FIG. 9.

FIG. 11 shows a more detailed circuit diagram of element 115 of FIG. 9 which determines the shape of the output pulses of shift register 102. The input 120 is connected to the output of shift register 102 and, on the other side, to inputs of the three NAND-gates 121, 122, 123. The clock input 124 receives the signal from the frequency divider 107 for the NAND-gates 122, 125. The clock input 126 receives the signal from the frequency divider 108 for the NAND-gates 123, 127. The output of gate 121 is connected to the NAND-gates 125, 127, while the outputs of the gates 122 and 127 in a wired-OR configuration are connected to the input of the invertor 128. The outputs of the gates 123 and 125 are connected in a wires-OR configuration to the junction of the resistors 129 and 130. These resistors are connected to the output of the inverter 128 via the resistors 131 and 132, respectively.

The junction of the resistors 129 and 131 is connected to a supply voltage +V. The junction of the resistors 130 and 132 is connected, via the resistor 133 and the capacitor 134, to the output 136 and, via the resistor 135, to ground. The outputs of the pair of gates 125, 123 and the output of the invertor 108 are denoted by 137 and 138 respectively.

Figure 12:
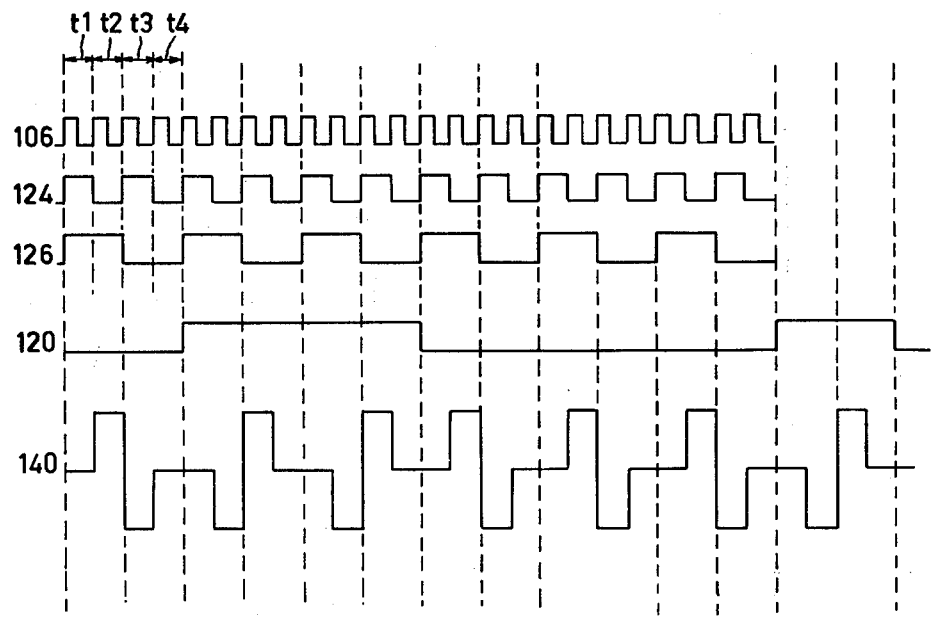
FIG. 12 shows time-dependent wave forms relevant to FIG. 11.

FIG. 12 shows wave forms of the clock 106, and the lines 124, 126, 120, 140. The clock frequency is each time divided by two by the elements 107, 108. The length of an information bit "0" or "1" corresponds to one period of the signal on terminal 126.

The first logic level arriving on line 120 is low, which corresponds to a binary "0" in the positive logic used. During a first period of the clock 106 the inputs 124 and 126 are high, the input 126 subsequently becomes low, etc. as shown in FIG. 12. The table below successively shows the logic output signals of the elements 102, 107, 108, 127, 122, 123, 125 on the points 137, 138. The upper half relates to the case where the shift register 102 supplies a logic "0" during four periods $t1 \ldots 4$, whilst the lower half relates to the case of a logic "1." The logic used may be, for example, DTL or TTL with open collector. For the determination of the output signals of the gates 122, 123, 125, 127 it is also assumed that the wired-OR functions are inactive.

| t | V: | 102: | 107: | 108: | 127: | 122: | 123: | 125: | 137: | 138: |
|---|---|---|---|---|---|---|---|---|---|---|
| $t_1$ | : | 0: | 1: | 1: | 0: | 1: | 1: | 0: | 0: | 1: |
| $t_2$ | : | 0: | 0: | 1: | 0: | 1: | 1: | 1: | 1: | 1: |
| $t_3$ | : | 0: | 1: | 0: | 1: | 1: | 1: | 0: | 0: | 0: |
| $t_4$ | : | 0: | 0: | 0: | 1: | 1: | 1: | 1: | 1: | 0: |
| $t_1$ | : | 1: | 1: | 1: | 1: | 0: | 0: | 1: | 0: | 1: |
| $t_2$ | : | 1: | 0: | 1: | 1: | 1: | 0: | 1: | 0: | 0: |
| $t_3$ | : | 1: | 1: | 0: | 1: | 0: | 1: | 1: | 1: | 1: |
| $t_4$ | : | 1: | 0: | 0: | 1: | 1: | 1: | 1: | 1: | 0: |

If the resistors 130 and 132 are equal and of a high value with respect to the resistor 129 and 131, the logic levels on the points 137 and 138 produce the voltages on the point 140 during the successive periods $t1 \ldots 4$ as a function of the logic level "0" or "1" on input 120. It is assumed that "1" corresponds to a voltage +V, and "0" to a voltage 0. The below table shows the results, the loading by the elements 133, 134 and 135 being ignored.

|  | 120 | 140 |
|---|---|---|
| $t_1$ | 0 | V/2 |
| $t_2$ | 0 | V |
| $t_3$ | 0 | 0 |
| $t_4$ | 0 | V/2 |
| $t_1$ | 1 | V/2 |
| $t_2$ | 1 | 0 |
| $t_3$ | 1 | V |
| $t_4$ | 1 | V/2 |

The output signal is made symmetrical with respect to earth by the capacitor 134, while the resistors 133, 135 act as matching resistors.

The idea of the invention can also be realized in other ways. Without modifications being necessary, use can be made of a very simple magnetic tape recorder having a capacity of approximately 2500 bits/s; taking into account the "blank" intervals, this implies about 150 octets per second.

Figure 13:
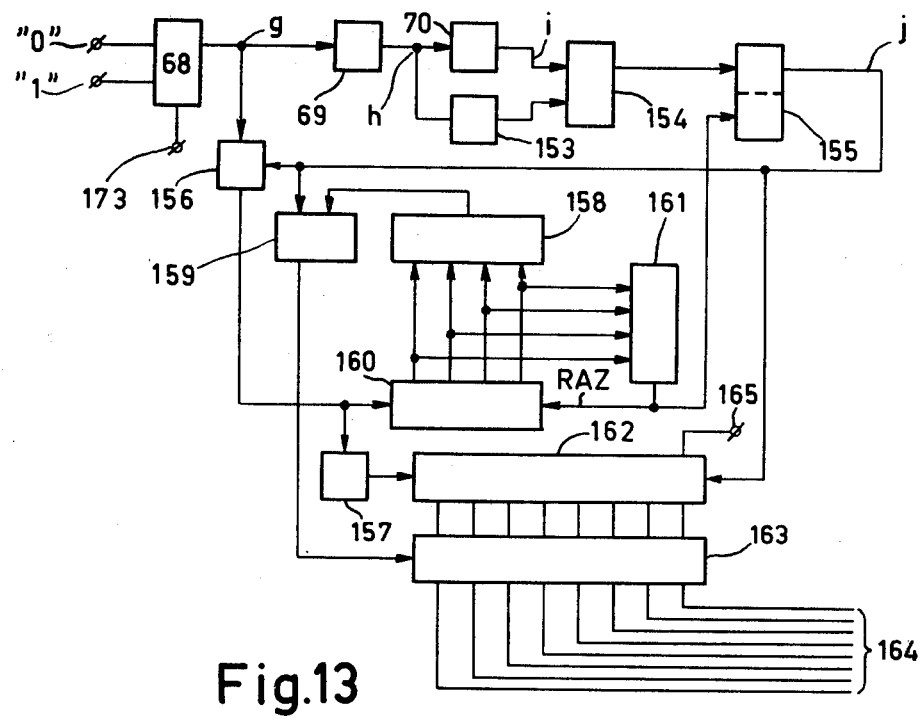
FIG. 13 shows a further detail of the circuit of FIG. 7.

FIG. 13 shows a more detailed diagram of another part of FIG. 7, corresponding elements being denoted by corresponding references. The output of the mixing device 68, receiving the "0" bits and the "1" bits, is connected to the integrator 69 and the coincidence detector 156. The output of the integrator 69 is connected to the monostable multivibrator 70 and the differentiator 153. The latter two are connected to input terminals of the coincidence detector, the output of which is connected to an input of an SR flipflop 155. The output of the flipflop 155 is connected to the coincidence detector 156, to the shift register 162, and to the coincidence detector 159. The output of coincidence detector 156 is connected to the delay unit 157 and to the decimal counter 160, the outputs of which are connected to the detector 158 which recognizes the position "9" of the decimal counter 160, and to the reset unit 161. The output of the reset unit 161 is connected to the reset input of the flipflop 155 and to the reset input (RAZ) of the counter 160. The output of the detector 158 is connected to the coincidence detector 159, and the latter is connected to the gate unit 163. The output of the delay unit 157 is connected to the shift register 162 which also comprises an information input 165. The information output from the shift register 162 can be effected via the gate unit 163, for example, eight bits in parallel via as many lines of the bundle 164.

Figure 14:
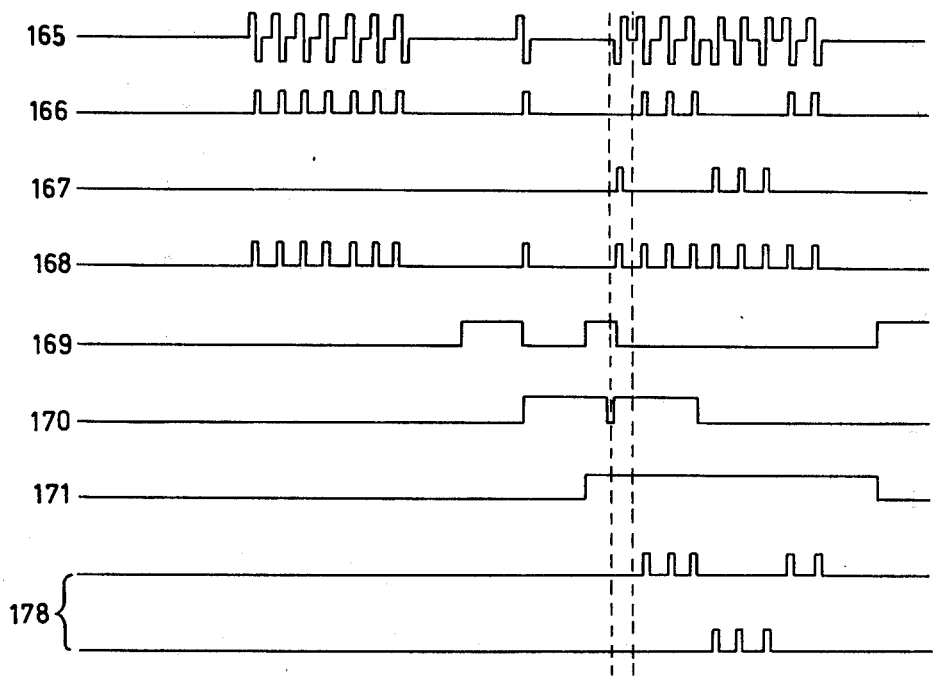
FIG. 14 shows a number of relevant time-dependent wave forms.

The operation of the circuit will be described inter alia with reference to FIG. 14. On the line 165 this Figure shows the signals stored on the magnetic tape; on line 166 it shows the logic "0" peaks originating from the peak detector 66 on line 167 the logic "1" peaks originating from the peak detector 67; on line 168 the output signals of the detector (mixing device) 68; on line 169 the output signals of the integrator 69; on line 170 the output signal of the monostable multivibrator 70; on line 171 the output signals on a "Q"-output of the flipflop 155, and on line 172 the signals on the D-input of the shift register 162.

In the circuit of FIG. 13 the binary input signal "0" and "1" are taken into account by the mixing unit 68 only if a high signal is present on the control terminal 173. If two successive pulses are lacking in the output signal of the mixing unit 68, the output signal of the integrator 69 becomes high (see signal variation on 169). The appearance of isolated pulse in the signal variation on 168 causes the signal 169 to become low again and, moreover, sets the monostable multivibrator 70 to the active position (signal 170 becomes high). The differentiator 153 differentiates the rising edges of the signal 169. If no further pulses occur in the signal variation 168 after the isolated pulse, the signal 169 again becomes high. The rising edge thereof is differentiated by the differentiator 153, while in the case of coincidence in the appearance of these two signals the coincidence detector 154 becomes passable, so that the flipflop 155 is changed over and the output signal 171 thereof becomes high.

If the coincidence detector 156 then detects an "1"-signal in the signal 168, in conjunction with a high level in the signal 171, it supplies a pulse to the delay unit 157 and to the counter 160 which is thus advanced one position. On the other side, the shift register 162 stores information signals "0" and "1" received on its input 165 as soon as the signal 171 is high. The delay unit 157 ensures that the output pulse of the coincidence detector 156 is delayed such that the output pulse arrives at the shift register 162 only if the information is already present on the input 165 in order to control the storage thereof in the said shift register. For each octet of information bits this register receives nine shift pulses, so that the first data pulse is systematically lost on the input 165. This does not matter, because it is always a "1." For each pulse received from the coincidence detector 156, the counter advances one step. When it reaches the position "9," the detector 158 supplies a pulse which reaches, together with the high output signal of the flipflop 155 (signal 171), the coincidence detector 159. The latter then supplies a pulse to the gate circuit 163, with the result that the information present in the shift register 162 becomes available on the line bundle 164.

Similarly, the reset detector 161 detects the position "0" of the counter 160 and dispatches, with a given delay, a reset pulse to this counter (with the result that the latter is reset to the position 0) and to the flipflop 155 (signal 171).

The idea of the invention can be used in other ways. For example, the absence of a larger number of pulses can be used for changing over the integrator. It is alternatively possible to use, for example, words comprising 16 or more bits.

What is claimed is:

1. A peak detector for detecting peaks of various amplitudes comprising:
   difference determining means having first and second inputs and an output;
   means for applying an input signal, having signal peaks at successive times and of arbitrary amplitude, to the first input of said difference determining means;
   analog storage means, comprising a capacitor having one terminal connected to said second input of said difference determining means for storing an analog reference level derived from the most recent signal peak of said input signal;
   charging means connected to the output of said difference determining means and responsive to a latter signal peak having an amplitude greater than the reference level of said analog storage means and operative for charging said capacitor;
   timing means having an input connected to the output of said difference determining means, and an output, said timing means being responsive to the trailing edge of a signal peak received on its input for generating a signal of predetermined duration of its output; and
   discharging means having a control input connected to the output of said timing means for partially discharging said capacitor by a predetermined fraction upon termination of an input signal peak for determining said analog reference as a fraction of the most recent signal peak.

2. A peak detector as defined in claim 1, wherein said charging means comprises a transistor having a current path series to said analog storage means.

3. A peak detector as defined in claim 1, wherein said discharging means comprises a field-effect transistor and a resistor connected in series.

4. A peak detector as defined in claim 1, wherein said difference determining means comprises a differential amplifier.

* * * * *